(12) United States Patent
Batko

(10) Patent No.: US 9,285,809 B2
(45) Date of Patent: Mar. 15, 2016

(54) CURRENT SOURCE WITH ACTIVE COMMON MODE REJECTION

(76) Inventor: Ivan Batko, Kosice (SL)

( * ) Notice: Subject to any disclaimer, the term of this patent is extended or adjusted under 35 U.S.C. 154(b) by 358 days.

(21) Appl. No.: 13/816,991

(22) PCT Filed: Aug. 30, 2011

(86) PCT No.: PCT/SK2011/050013
§ 371 (c)(1),
(2), (4) Date: Feb. 14, 2013

(87) PCT Pub. No.: WO2012/053992
PCT Pub. Date: Apr. 26, 2012

(65) Prior Publication Data
US 2013/0141057 A1    Jun. 6, 2013

(30) Foreign Application Priority Data

Sep. 3, 2010   (SK) ...................... 98-2010

(51) Int. Cl.
*G05F 1/10*        (2006.01)
*G05F 1/565*       (2006.01)
*H03F 3/45*        (2006.01)

(52) U.S. Cl.
CPC  *G05F 1/10* (2013.01); *G05F 1/565* (2013.01); *H03F 3/45475* (2013.01); *H03F 3/45937* (2013.01); *H03F 2200/261* (2013.01); *H03F 2203/45418* (2013.01); *H03F 2203/45422* (2013.01); *H03F 2203/45424* (2013.01); *H03F 2203/45441* (2013.01); *H03F 2203/45511* (2013.01); *H03F 2203/45512* (2013.01)

(58) Field of Classification Search
CPC ... G05F 1/10; H03F 3/45937; H03F 3/45475; H03F 1/565; H03F 2203/45441; H03F 2203/45418; H03F 2203/45512; H03F 2203/45422; H03F 2203/45424; H03F 2203/45511; H03F 2200/261
See application file for complete search history.

(56) References Cited

U.S. PATENT DOCUMENTS

| 6,411,098 B1 * | 6/2002 | Laletin | 324/436 |
| 6,501,255 B2 * | 12/2002 | Pomeroy | 323/312 |
| 6,784,698 B1 * | 8/2004 | Brenden | 327/51 |
| 8,179,195 B1 * | 5/2012 | Huijsing et al. | 330/9 |
| 2008/0284507 A1 * | 11/2008 | Pertijs et al. | 330/9 |

FOREIGN PATENT DOCUMENTS

| ES | 2143411 A1 | 5/2000 |
| WO | WO 2004/106946 A2 | 12/2004 |

OTHER PUBLICATIONS

International Search Report, Feb. 28, 2012 from International Phase of the instant application.

* cited by examiner

*Primary Examiner* — Jung Kim
(74) *Attorney, Agent, or Firm* — Ostrolenk Faber LLP

(57) ABSTRACT

A current source with active common mode rejection uses a principle of having a branch for the generation of the required current, to the output (107) of which one end of the load (3) is connected; and a branch of the active compensation circuit (ACC) (200), to the output (203) of which the other end of the load (3) is connected. By means of at least one input (201) of the ACC (200), at least one signal is sensed on the load, and subsequently it is processed so that the result of processing of at least one signal from at least one input (201) preferentially represents the common mode voltage, which corresponds to the pair of voltages at the voltage terminals (1) and (2) of the load (3), or voltage close to the common mode voltage. This result is subsequently processed by the regulating circuits of the ACC (200), which compare it to the reference potential value (4), and using the negative feedback principle, set such voltage on the output (203), which, within the control accuracy, leads to the equivalence of the reference potential (4) and the potential corresponding to the result of processing of at least one signal from at least one input (201).

8 Claims, 6 Drawing Sheets

Fig. 1 – Prior Art
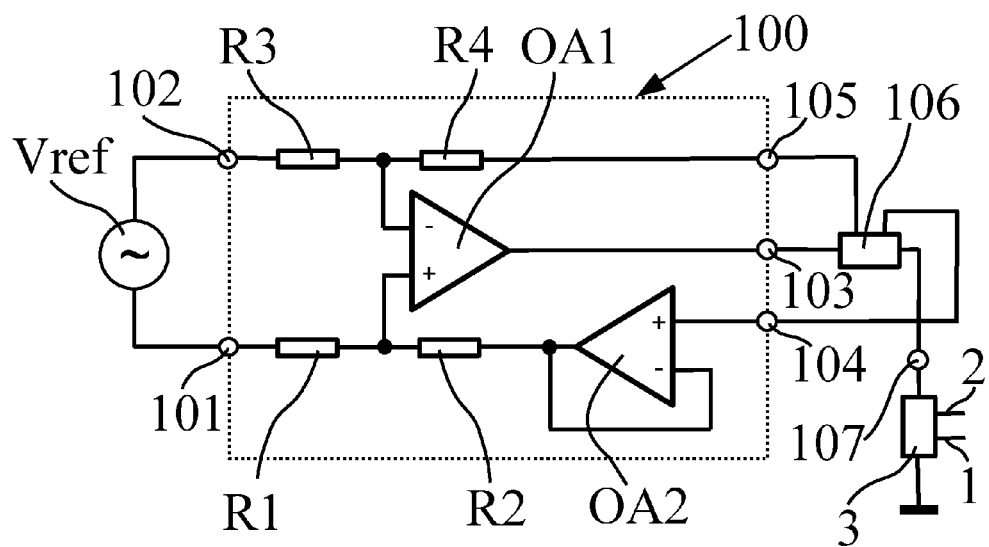
Fig. 2 - Prior Art
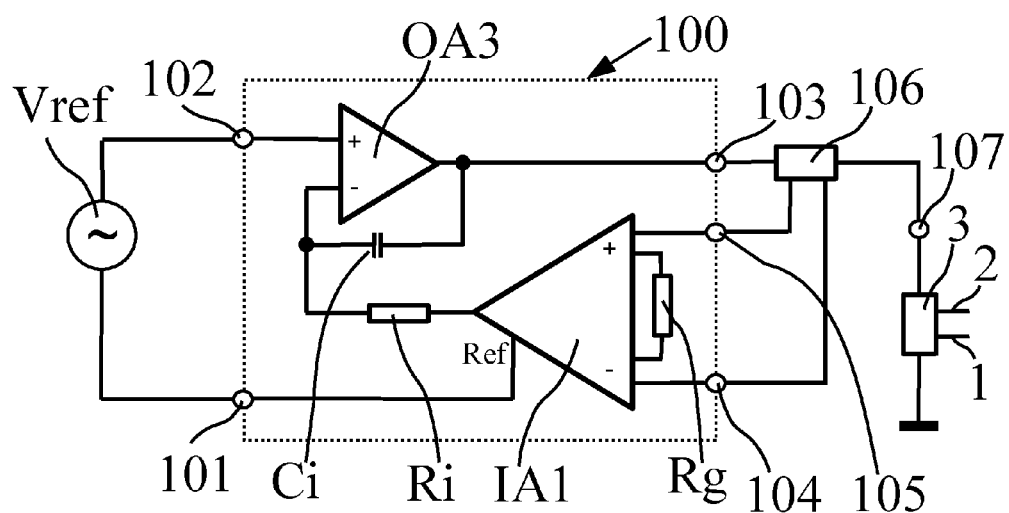

Fig. 3 - Prior Art
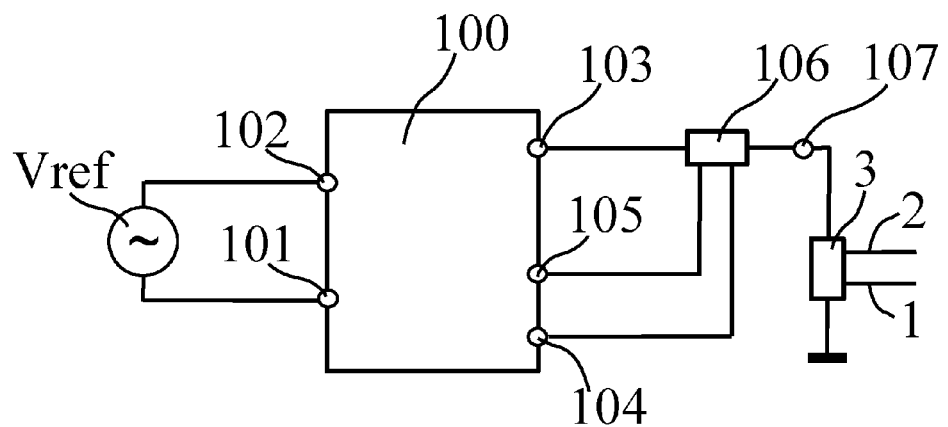
Fig. 4 - Prior Art
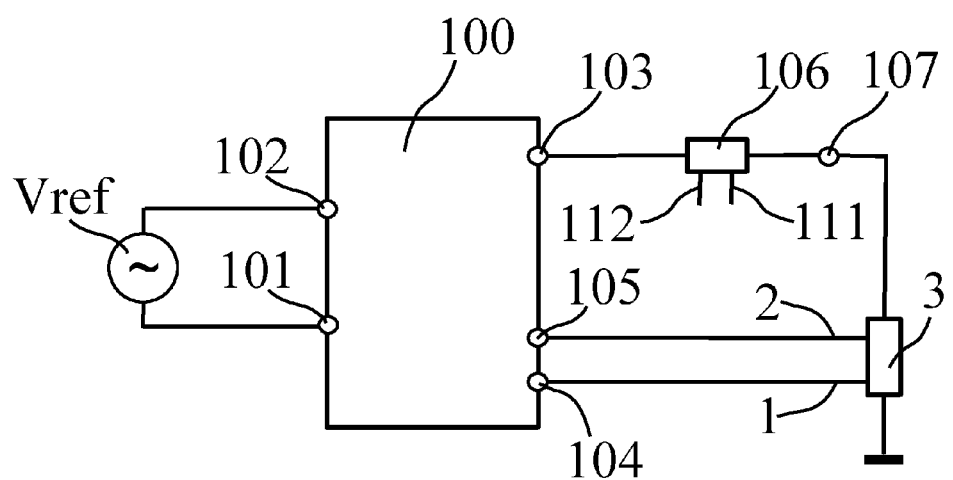

Fig. 5 - Prior Art
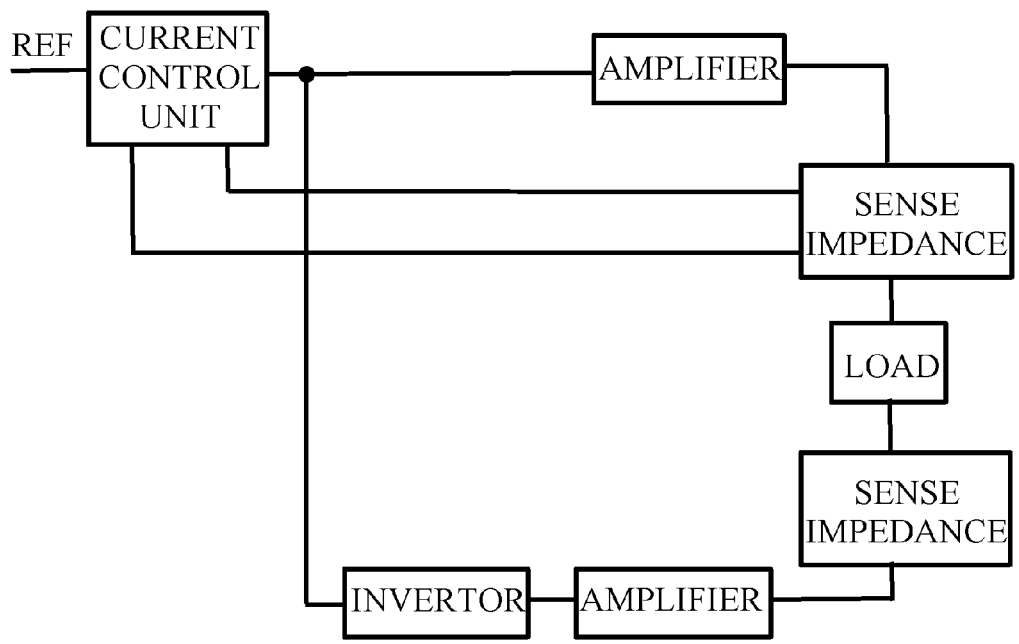

CURRENT SOURCE WITH ACTIVE COMMON MODE REJECTION

FIELD OF INVENTION

The invention relates to current sources; in particular the current sources used to provide excitation current to the load when measuring its impedance. The proposed type of the current source is particularly suitable for measurements of low electric resistance by using the four-probe method; mainly in applications, where the load resistance compared to the resistance of leading wires is low.

STATE OF THE ART

Currently, several different versions of current sources (CS), which can be used as an excitation current source when measuring impedance of various load types, are known. A special category is represented by the CS designed to supply current for the purpose of the precision measurements of resistance of various loads types, e.g. in the precision measurements of resistance of resistors, resistance thermometers, tensometers, magnetoresistors, Hall sensors, resistance of electrically conductive materials in the area of material research, etc. Very specific requirements on the CS arise in situations, when the load resistance compared with the resistance of electrical leads is very low. In such case, the use of an asymmetric CS, one terminal of which is grounded, e.g. by a voltage controlled CS (VCCS) shown in FIGS. 1 to 4, creates a major error in measurements of the voltage drop on the measured load by means of a differential amplifier (hereinafter referred to as DA), from the so called common mode voltage, which appears on the DA inputs. This error originates from the fact that a measured (very low) voltage drop generated on the measured load is measured in the presence of a much higher common mode voltage, which is generated on electric leads as a result of the measuring current flow; and also in the fact that the ability of an actual DA to reject the effect of the common mode voltage (expressed by the CMRR parameter—from "Common Mode Rejection Ratio") is finite.

As described in U.S. Pat. No. 5,021,729, this principal drawback of the asymmetric CS (the block diagrams of which are shown in FIGS. 3 and 4) can be substantially eliminated by means of a differential CS. The differential CS described in the U.S. Pat. No. 5,021,729 patent is designed on the basis of operational amplifiers, and in fact provides symmetric excitation of the load. Another voltage controlled differential CS described in the U.S. Pat. No. 6,501,255B2 patent uses two identical, modified Howland current sources, which are controlled by a opposite polarity voltage, while each of them excites one of the measured load ends. The circuitry contains also an active feedback, which ensures the centering of operating voltage on the current source terminals. The circuit enables active reduction of the effect of the common mode voltage on the measurement of the voltage drop on the load. Another solution is represented by a balanced bi-directional CS described in the U.S. Pat. No. 6,611,167B2 patent. This CS uses a circuitry, where the output voltage of the current control unit controls two amplifiers for individual branches of the CS in the bridge connection (see FIG. 5), with the equally high impedances between the amplifier terminals and the measured load (where one of them serves as sensing/reference for the current control purposes).

The differential CS, in case of which the equal impedance between the output terminals of the CS and the load in both branches (as e.g. in the design shown in FIG. 5) is required to eliminate the effect of the common mode voltage, have a drawback, namely if a change of the ratio of these impedances occurs (for example, in case of different changes of impedances resulting from temperature changes), simultaneously also the increase of the common mode voltage occurs, which results in the increase of the related measurement error. Therefore, for the purpose of the precision measurements it is desired to propose a CS capable of eliminating these errors, or a CS, which eliminates the common mode voltages on the measured load, even in case of significantly different and variable impedance ratios in the both branches. The description of these, conceptually new types of the CS, is the subject of the present invention.

SUBJECT MATTER OF THE INVENTION

The main object of the present invention is to provide a conceptually new type of the current source (CS) with the active common mode rejection on the measured load, which supplies necessary current to the measured load, and simultaneously maintains the potential representing the common mode voltage (or a voltage close to it), which corresponds to the signal measured on the load at the level of the predefined reference potential (as a rule, to the signal ground potential of the measuring system), even in case, when the impedances in the branches of the current leads are different and/or varying. Within this description, the common mode voltage is defined as the quantity $Vcm=(V1+V2)/2$, where voltage potentials sensed at the measured load, V1 and V2, are defined against the aforementioned reference potential, while the measured voltage drop on the load is represented by the difference between these potentials, V2−V1.

In order to achieve this goal, the CS is designed, which has a VCCS branch (for example VCCS, whose block diagram is shown in FIG. 3 or 4) connected to one end of the load, and an active compensation circuit (hereinafter ACC), which is represented by a self-adjusting voltage supply, connected to the other end of the load. The ACC control circuits are controlled by the voltage derived from the voltage potentials sensed on the load (however, preferentially directly by the common mode voltage or the voltage close to the common mode voltage) and the reference potential, and operate so that they set such voltage on the ACC output that the common mode voltage corresponding to the sensed pair of voltage potentials on the measured load (and which are supplied to the DA inputs) is maintained at the level of the predefined reference potential (as a rule, at the level of the signal ground potential of the measuring system). Pursuant to the invention, the said CS, one branch of which is represented by the CS for the generation of the required current to the load, and the other branch is represented by the ACC, which ensures compensation (zeroing) or a significant reduction of the common mode voltage at the load voltage terminals can principally be implemented using these approaches.

In one approach applicable for direct currents and low frequency alternating currents, the ACC is preferentially represented by such a control circuit, the input unit of which senses the voltage potentials on the load (preferentially the same as those simultaneously used for the purpose of measuring the voltage drop on the load) and, based on them, generates the common mode voltage. The following regulating element, which uses the negative feedback principle, and is represented, for example, by an integral (I), proportional and integral (PI) or proportional, integral and derivative (PID) element, compares the sensed signal provided by the input unit against the reference potential, and dynamically keeps the difference between the instant value of the potential on the output of the input unit and the reference potential at the zero value.

In another approach applied for alternating currents, the ACC is represented by a variable gain amplifier, which amplifies the voltage that is directly proportional to the alternating current flowing through the load. The amplification of the variable gain amplifier is controlled by the control circuit with the negative feedback, so that the amplitude of the common mode signal sensed on the load (which, similarly to the previous case, is generated by the ACC input unit) is zero. For example, for loads of resistive nature, this control circuit can be realized as a phase-sensitive detector (hereinafter referred to as PSD), which measures an actual element of the difference between the reference potential and the potential preferentially representing the common mode voltage at the load voltage terminals, and the output of which is applied to the regulating element of the integral type (possibly also PI or PID type). Subsequently, the output of the integrator or the regulating element of the PI or PID type controls the gain of the variable gain amplifier. To put it simply, the control circuit using the principle of the negative feedback sets such gain of the variable gain amplifier, which enables that the alternating voltage on the ACC output, which must be in anti-phase with the voltage on the output branches of the CS supplying current to the load, is of the size at which the common mode voltage derived from the signals sensed on the load (detected by means of the PSD) is zero.

For the better understanding of the method of functioning and specific characteristics of the described approaches, the following examples of the invention implementation and the attached images are provided.

AN OVERVIEW OF FIGURES ON THE DRAWINGS

FIGS. 1 and 2 schematically illustrate examples of the implementation of asymmetric current sources which supply current to the grounded load.

FIG. 3 shows the block diagram of the asymmetric current source, which maintains a constant amplitude/value of the alternating/direct current flowing through the load.

FIG. 4 shows the block diagram of the asymmetric current source, which maintains constant amplitude/value of the excitation voltage generated on the load.

FIG. 5 shows the block diagram of the balanced bi-directional current source described in U.S. Pat. No. 6,611,167B2 patent.

Figure 6:
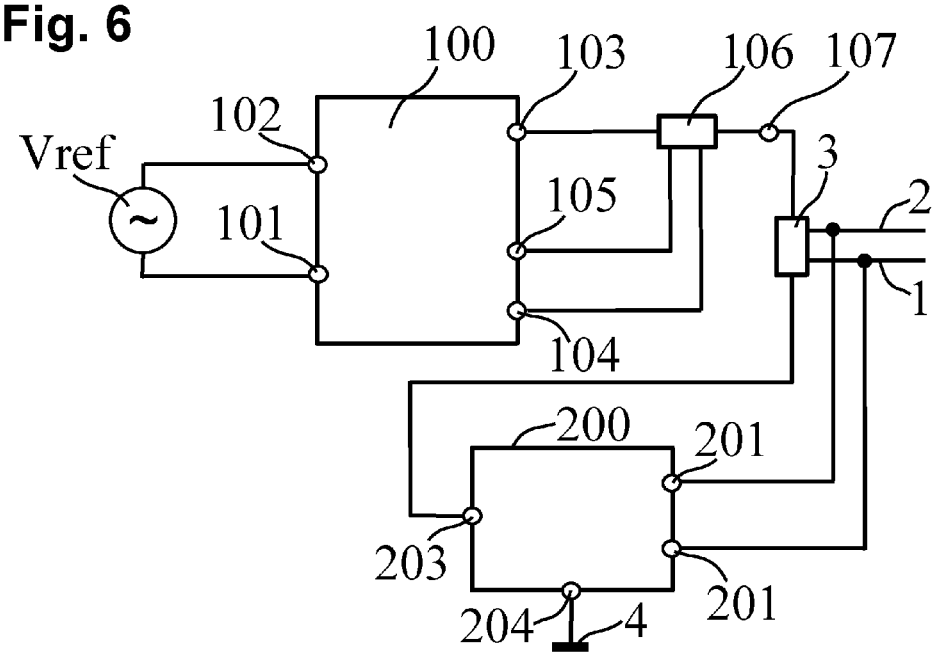
Figure 7:
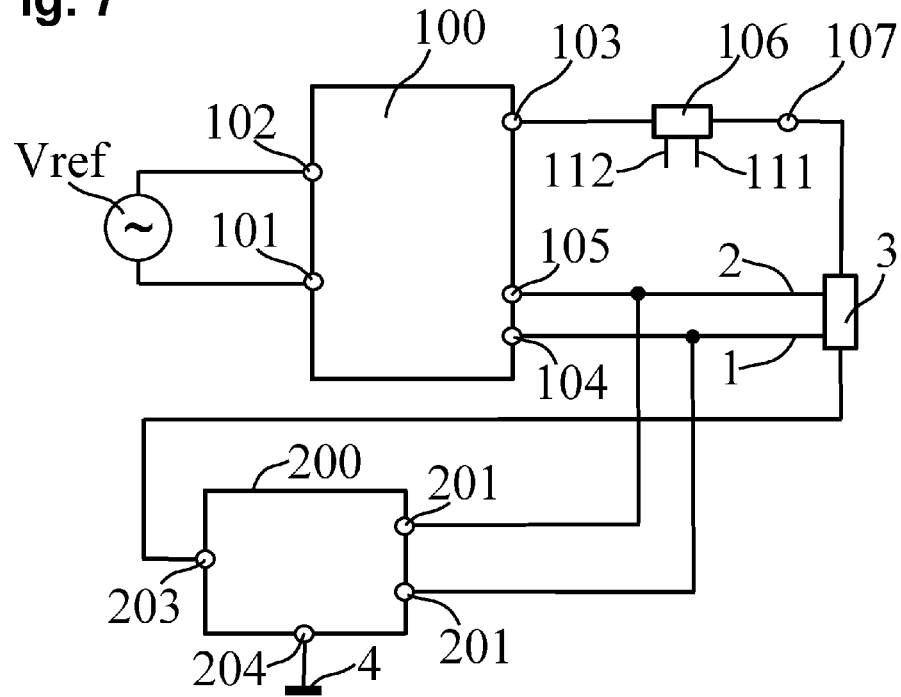

FIG. 6 shows the block diagram of the CS with the active common mode rejection pursuant to the invention, where the contained VCCS maintains a constant level of the current flowing through the load, while FIG. 7 shows an analogical block diagram, where the contained VCCS maintains a constant level of the excitation voltage on the load.

Figure 8:
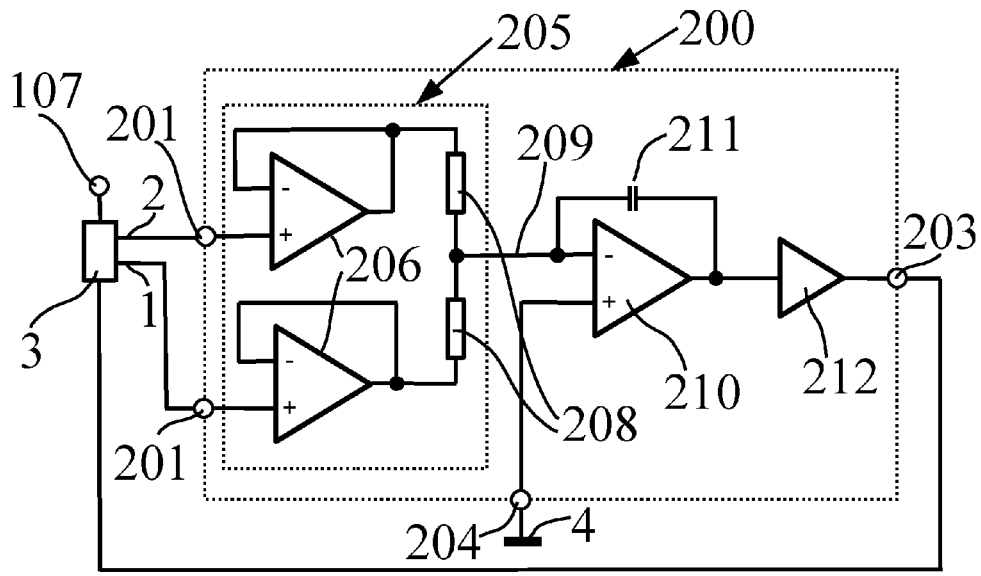

FIG. 8 shows an example of the ACC implementation pursuant to the invention, for direct and low frequency alternating currents.

Figure 9:
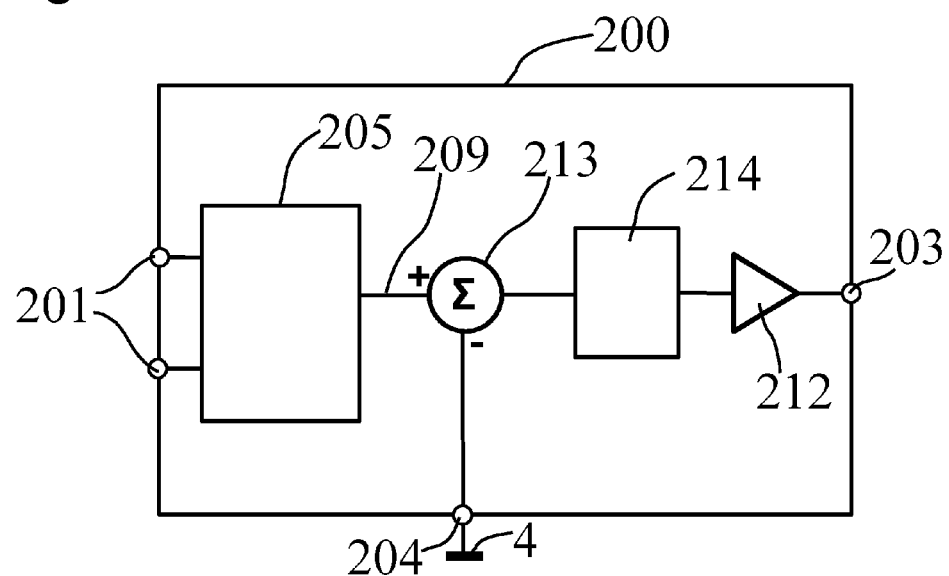

FIG. 9 shows the block diagram of the ACC pursuant to the invention for direct and low frequency alternating currents.

Figure 10:
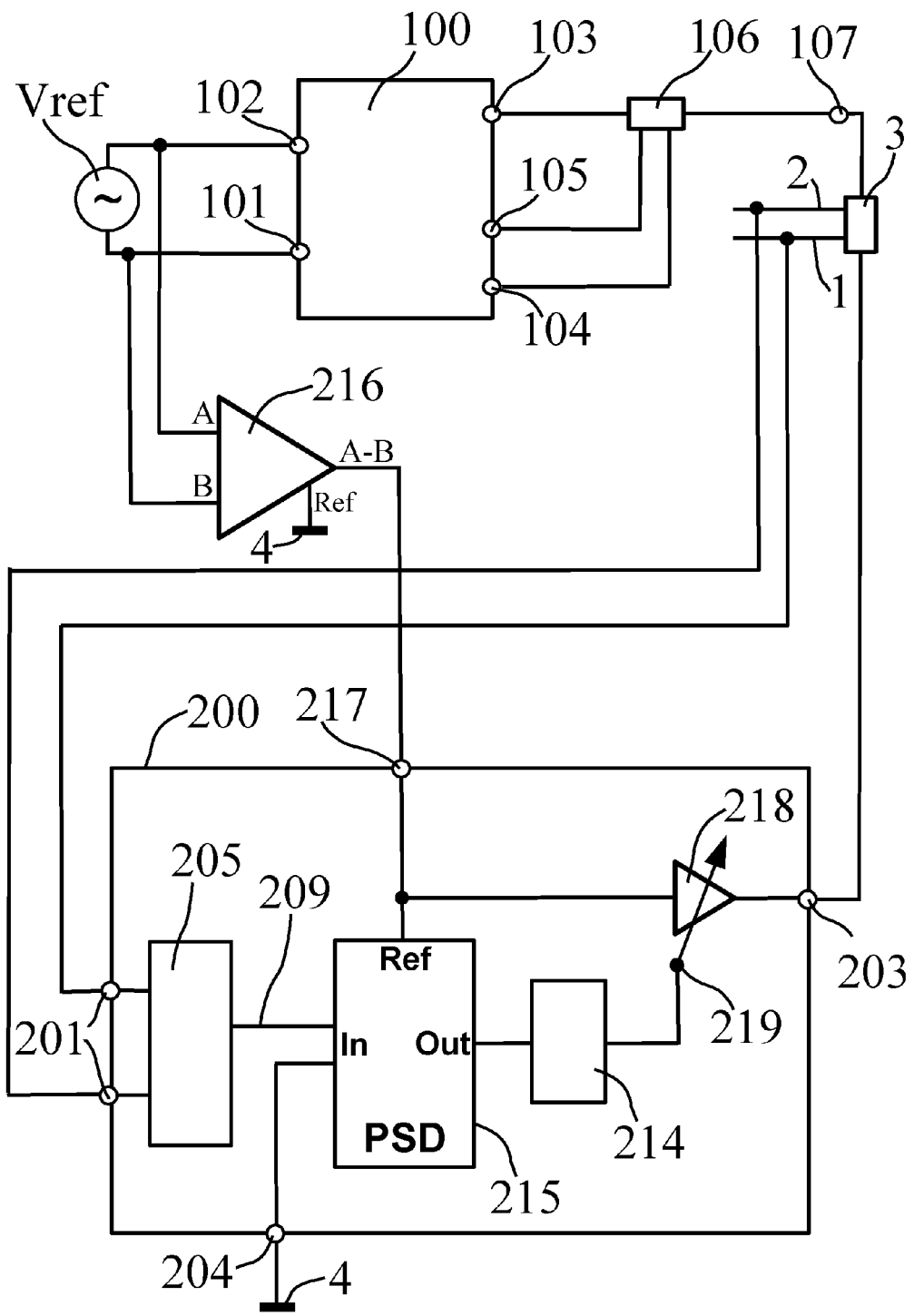

FIG. 10 schematically illustrates the block diagram of the alternating CS pursuant to the invention, which uses the variable gain amplifier and the phase-sensitive detection.

EXAMPLES OF THE INVENTION IMPLEMENTATION

FIG. 6 shows the block diagram of the current source pursuant to the invention, one branch of which is represented by the VCCS, to the output 107 of which one end of the load 3 is connected, while the other branch is represented by the ACC 200, to the output 203 of which the other end of the load 3 is connected. The VCCS suitable for excitation of the grounded load or the load connected to the defined potential can be used as a VCCS. A lot of well-known designs suit this purpose, e.g. the VCCS shown in FIG. 1, FIG. 2 or the VCCS shown as a block diagram in FIG. 3. In this version, the voltage Vrn on the reference impedance 106 is sensed by means of the sensing inputs 104 and 105 of the current control unit (CCU) 100, while the CCU 100 maintains Vrn directly proportional to the reference voltage Vref, which is represented by the difference of voltages on the inputs 102 and 101 of the CCU 100. For the purpose of the description of this invention, a resistor with the Rn value shall be considered the reference impedance 106. Then the current I supplied by the VCCS is directly proportional to the Vref/Rn ratio, while the proportionality constant (positive or negative) is given by a particular circuit design of the VCCS. For example, if the VCCS shown in FIG. 1, with the identical values of resistors R1, R2, R3 and R4, is considered, then the current flowing through the load 3 equals to I=−Vref/Rn.

In case, when the measured load 3 must be excited in order to ensure that the flowing current maintains the excitation voltage on the load 3 at the constant level, it is possible to use the VCCS, whose block scheme is shown in FIG. 4, in combination with the ACC, as shown in FIG. 7. In this case the CCU 100 senses the voltage drop on the load 3 on its voltage terminals 1 and 2 by means of the sensing inputs 104 and 105, and maintains them directly proportional to the reference voltage Vref. The CCU 100 suitable for this purpose is represented, for example, by the circuitry shown in FIG. 2. (This CCU 100 maintains the voltage Vmer between the load voltage terminals 1 and 2 at the level of Vmer=Vref/G, where G is the amplification of the instrumentation amplifier IA1 set by the resistor Rg value. The value of the current flowing through the load 3 is then determined by the formula I=Vrn/Rn, where Vrn is the voltage measured at the voltage terminals 111 and 112 of the reference impedance 106.)

The ACC 200 represents the core unit of the present invention. As seen in FIGS. 6-10, the voltage signals 1, 2 sensed on the load 3 are applied to its inputs 201, while the reference potential 4 is applied to the reference potential input 204 of the ACC 200 for the purpose of the regulation of the load 3 potential levels. The signal ground potential of the measuring system is suitable to be used as the reference potential 4. In accordance with the block diagrams shown in FIGS. 6 and 7, the current source pursuant to the invention shall be created from the branch for the generation of the required current, to the output 107 of which one end of the load 3 is connected, and from the branch of the active compensation circuit (ACC) 200, to the output 203 of which the other end of the load 3 is connected. In this connection at least one signal on the load is sensed by means of at least one input 201 of the ACC 200, and subsequently it is processed, so that the result of processing of at least one signal from at least one input 201 preferentially represents a common mode voltage, which corresponds to the pair of voltages at the voltage terminals 1 and 2 of the load 3 or the voltage close to the common mode voltage. Subsequently, in accordance with the ACC 200 definition, this result of processing is compared with the reference potential value 4, and using the negative feedback principle, such voltage is set on the output 203 of ACC 200, which, within the control accuracy, results in the equivalence of the reference potential 4 and the potential corresponding to the above described result of processing of at least one signal from at least one input 201.

The block diagrams in FIGS. 6 and 7 correspond to the situation, when the ACC 200 controls an instant deviation of potentials sensed on the load 3 from the reference potential 4 and which are particularly suitable for direct and low frequency alternating applications. A particular example of the implementation of the ACC 200 for the resistive load and direct currents or low frequency alternating currents is shown in FIG. 8. (In case of load impedances of other than resistive nature, this connection should be adequately optimized.) In this version, the input unit 205 of the ACC 200 consists of the voltage followers 206, the inputs of which are correspondingly interconnected with the inputs 201 of the ACC 200. The follower outputs 206 are led to the voltage divider represented by the resistors 208. If the voltages from the sensing voltage terminals 1 and 2 of the load 3 are applied to the inputs 201 (as illustrated in FIG. 8), then for the same values of the resistors 208, the potential of their connection, which simultaneously represents the output 209 of the input unit 205, is equal to a common mode voltage on the load 3. The output 209 is subsequently led to the inverting input of the operational amplifier (OA) 210, which is connected as an integrator, while the potential from the reference potential 204 input is applied to a non-inverting input of the OA. The time constant of this (summing) integrator given by the capacitor 211 capacity and the resistors 208 resistance should be sufficiently high to ensure the connection stability, and simultaneously it must be sufficiently low (particularly in alternating applications), so that the slew rate on the output 203 of the ACC 200 is sufficient to adjust the output 209 potential to the level of the reference potential 4. The optional output stage 212 reduces the output current load of the OA 210, eliminates undesirable effects caused by the connected load, and enables the increase of the output 203 current. It can also be used to increase or limit the voltage swing on the output 203. In certain applications, e.g., when high output currents are not required, it can be either replaced by a suitable resistor or completely left out.

The design shown in FIG. 8 can be considered a special case of a more complex design shown in FIG. 9. As seen in FIG. 9, the differential (and possibly also amplified) signal of the output 209 of the input unit 205, and the reference potential 4 from the output of the differential element 213 is applied to the regulating element 214 input, which provides a suitable negative feedback. It is possible to use, for example, the PID element, the PI element, or the integral element as a regulating element 214.

On the other hand, the design shown in FIG. 8 can be significantly simplified for the purpose of certain application. For very low load impedances and sufficiently high values of the resistors 208, the voltage followers 206 can be left out. Moreover, if an OA with a sufficiently low slew rate is used as the OA 210, the capacitor 211 can be left out, too.

FIG. 10 shows another design suitable for alternating currents. In this case, the ACC 200 consists of the input element 205, the phase-sensitive detector 215 (in FIG. 10 marked also by a widely-used acronym PSD), the regulating element 214 and the variable gain amplifier 218. The input element 205 and the regulating element 214 have characteristics similar to those of the design shown in FIG. 9. The voltage representing (both in terms of amplitude and phase) the current controlled by the CCU 100 is applied to the input 217 of the ACC 200. The version according to the design shown in FIG. 10 uses the voltage directly proportional to the reference voltage Vref for this purpose, which is defined against the reference potential 4, which is achieved by using a suitable differential amplifier 216 with the output defined against the required reference potential 4. (Analogically, the voltage drop on the reference impedance 106 can also be used for this purpose). If, in accordance with the situation illustrated in FIG. 10, we assume that Vref is also defined against the reference potential 4 (i.e., that one of the inputs 101 or 102 is interconnected with the reference potential 4), and the CCU 100 is configured to supply current to the load 3 not inverted against Vref, then the differential amplifier 216 can be left out. Subsequently, the voltage from the reference input 217 is applied to the input of the variable gain amplifier 218, which is configured either as an inverting or a non-inverting amplifier, depending on whether the reference voltage applied to the reference input 217 is in phase or anti-phase with the alternating voltage on the output 107 of the VCCS; while one of the said types is selected so that the opposite phase of the alternating voltage on the output 203 of the ACC against the alternating voltage on the output 107 of VCCS is ensured. (For example, if for the design shown in FIG. 10 we assume that the reference voltage applied to the reference input 217 is in the phase with the voltage on the output 107, then the variable gain amplifier 218 is configured as an inverting amplifier.) Simultaneously, the voltage from the reference input 217 of the ACC 200 is applied to the input of the phase-sensitive detector 215, which uses this voltage as a reference voltage for the purpose of the phase-sensitive detection, which is used to determine the amplitude (represented by the absolute value of the output voltage from the phase-sensitive detector 215) and the phase (represented by the polarity of the output voltage from the phase-sensitive detector 215) of the potential difference on the output 209 of the input unit 205 and the reference potential 4. Subsequently, the voltage representing this difference (direct voltage of both possible polarities on the output of the phase-sensitive detector 215) is applied to the regulating element 214 input. The regulating element 214, which is used to control the gain of the variable gain amplifier 218 by means of its control input 219, is configured so that the signal detection by means of the phase-sensitive detector 215 in phase with the voltage on the output 203 from the variable gain amplifier 218 results in the reduction of the gain of the variable gain amplifier 218, and vice versa.

There are also other alternatives and variations of the proposed solutions, which are not given in the description, but are obvious to an expert, as they logically result from the provided description and given examples. It must also be borne in mind that the current source operating on the basis of the given principle may also be practically constructed with the partial use of commercially available external modules, for example PID modules and/or phase-sensitive detectors (often called "Lock-In amplifiers").

From the viewpoint of measurement accuracy it should be noted that for many practical applications it is sufficient to use only one signal conductor connected to the load 3, and to use the ACC 200 with a single input 201 to control the ACC 200. (In accordance with this description of the invention and the given examples, the said case is equivalent to the situation, when only one and the same signal sensed on the load 3 is applied to all inputs 201. It must also be borne in mind that for the purpose of specific measurements, the need of which may arise from practice, not only a time-invariant potential of the ground nature, but also a time-variable potential may be used as a reference potential. This fact may be used to advantage in applications, where levels of the load potential must be maintained at the level of a predefined (constant or time-variable) potential.

INDUSTRIAL APPLICATION

It is supposed that the main use of the invention will be for high precision measurements of resistance of electrically conductive materials and resistive sensors. The proposed type of the current source is particularly suitable for the measurement of low electric resistance by using the four-probe method, and it finds use where the load resistance compared with the resistance of leading wires is low, and it is necessary to eliminate common mode voltage errors. It is particularly suitable for the use in combination with sensitive Lock-In amplifiers, where the CS, pursuant to the invention, can be used for the measurements of highly conductive materials in the area of resistance thermometry, measurements of Hall voltage, etc. Pursuant to the invention, the current source may represent a basis for the construction of precise conductance or resistance bridges for precision measurements of conductance or resistance or for the construction of other precise instruments, where the current excitation of the measured load/sensor is required, and simultaneously it is necessary to eliminate undesirable effects causes by the common mode voltage, or where it is needed to excite the load so that its potential is maintained at the required level.

The invention claimed is:

1. A current source for connection with a load, the current source comprising:
   a current control unit including feedback sensing inputs for sensing generated current by sensing voltage at a reference impedance or voltage at the load, and an output configured to be connected to the load; and
   an active compensation circuit including a reference input configured to be connected to a reference node that is not connected to the load, and a compensation input configured to be connected to the load, and an output configured to be connected to the load such that the load is between the output of the current control unit and the output of the active compensation circuit,
the active compensation circuit further including a negative feedback circuit that is responsive to the reference input and the compensation input, to generate a signal on the output of the active compensation circuit,
wherein the negative feedback circuit is responsive to the compensation input via a signal that is a function of the compensation input, and
wherein the signal on the output of the active compensation circuit results in an equivalence of a signal applied to the reference input and the signal that is a function of the compensation input.

2. A current source according to claim 1 wherein the active compensation circuit has a regulating element for setting potential on the output of the active compensation circuit, the regulating element being of proportional-integral-derivative type or proportional-integral type, or of integral type.

3. A current source according to claim 2 wherein the active compensation circuit further includes a voltage follower or voltage amplifier to follow or amplify a signal from the compensation input.

4. A current source according to claim 3 wherein the regulating element includes a summing integrator.

5. A current source according to claim 1 wherein the active compensation circuit further includes an amplifier connected between the negative feedback circuit and the output of the active compensation circuit.

6. A current source according to claim 1 wherein the load includes a first end and a second end, the output of the current control unit is configured to be connected to the first end of the load, and the output of the active compensation circuit is configured to be connected to the second end of the load.

7. A current source according to claim 1 wherein the active compensation circuit further includes a second compensation input configured to be connected to the load such that the first and second compensation inputs measure a voltage drop on the load, and the negative feedback circuit is responsive to the reference input and a common mode voltage of the first and second compensation inputs, to generate the signal on the output of the active compensation circuit.

8. A current source according to claim 1 wherein the active compensation circuit further includes a second compensation input configured to be connected to the load such that the first and second compensation inputs measure a voltage drop on the load, and the negative feedback circuit is responsive to the reference input and a common mode voltage of the first and second compensation inputs, and wherein the signal on the output of the active compensation circuit results in an equivalence of a signal applied to the reference input and common mode voltage of the first and the second compensation inputs.

* * * * *